:::::::::::: US009608109B1

(12) United States Patent
Tsai et al.

(10) Patent No.: US 9,608,109 B1
(45) Date of Patent: Mar. 28, 2017

(54) N-CHANNEL DEMOS DEVICE (71) Applicant: Texas Instruments Incorporated, Dallas, TX (US)

(72) Inventors: Chin-Yu Tsai, Allen, TX (US); Imran Khan, Richardson, TX (US); Shaoping Tang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/135,117

(22) Filed: Apr. 21, 2016

(51) Int. Cl.
*H01L 29/78* (2006.01)
*H01L 29/08* (2006.01)
*H01L 29/10* (2006.01)
*H01L 29/06* (2006.01)
*H01L 21/265* (2006.01)
*H01L 29/66* (2006.01)
*H01L 21/762* (2006.01)
*H01L 29/167* (2006.01)
*H01L 27/06* (2006.01)

(52) U.S. Cl.
CPC .... *H01L 29/7835* (2013.01); *H01L 21/26513* (2013.01); *H01L 21/76202* (2013.01); *H01L 29/0649* (2013.01); *H01L 29/0847* (2013.01); *H01L 29/1033* (2013.01); *H01L 29/167* (2013.01); *H01L 29/66575* (2013.01); *H01L 29/66659* (2013.01); *H01L 27/0629* (2013.01)

(58) Field of Classification Search
None
See application file for complete search history.

(56) References Cited

U.S. PATENT DOCUMENTS

| 7,915,678 | B1 | 3/2011 | Vashchenko | |
|---|---|---|---|---|
| 2009/0315110 | A1* | 12/2009 | Vashchenko | H01L 29/0692 257/344 |
| 2010/0038706 | A1* | 2/2010 | Kitajima | H01L 27/0259 257/328 |
| 2013/0264640 | A1* | 10/2013 | Salman | H01L 29/66659 257/343 |

* cited by examiner

*Primary Examiner* — Daniel Whalen
(74) *Attorney, Agent, or Firm* — Jacqueline J. Garner; Charles A. Brill; Frank D. Cimino (57) ABSTRACT

An n-channel DEMOS device a pwell finger defining a length and a width direction formed within a doped surface layer. A first nwell is on one side of the pwell finger including a source and a second nwell on an opposite side of the pwell finger includes a drain. A gate stack is over a channel region the pwell finger between the source and drain. A field dielectric layer is on the surface layer defining a first active area including a first active area boundary along the width direction (WD boundary) that has the channel region therein. A first p-type layer is outside the first active area at least a first minimum distance from the WD boundary and a second p-type layer is doped less and is closer to the WD boundary than the first minimum distance.

18 Claims, 7 Drawing Sheets

N-CHANNEL DEMOS DEVICE

FIELD

Disclosed embodiments relate to n-channel drain extended metal oxide semiconductor (DEMOS) devices.

BACKGROUND

Power semiconductor devices can be fabricated using n- or p-channel DEMOS structures. DENMOS devices extend the n+ drain of the device by adding a p-type drain drift region between the drain and the channel of the device, trapping the majority of the electric field in this region instead of the channel region, therefore containing hot carrier effects to this region, instead of the channel region therefore increasing hot carrier reliability. The DEMOS device can have a symmetric drain structure or an asymmetric drain structure.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for conventional n-channel drain extended metal oxide semiconductor (DENMOS) devices that include at least one pwell finger adding an extra p-type layer at the pwell finger-end adjacent to the active area boundary in the width direction with the field dielectric (WD boundary) can help prevent high Ioff leakage. However, this extra p-type layer can produce impact ionization leakage causing transistor shifts at ON-state with high back gate bias levels. Disclosed DENMOS devices instead include a plurality of extra p-type layers at the pwell finger-end adjacent to the WD boundary, including a higher doped first p-type layer at a first minimum distance away from the WD boundary compared to a lower doped second p-type layer that is closer than the first p-type layer to the WD boundary, including over WD boundary (and this into the active area) in one embodiment. The first p-type layer being spaced back (or recessed) from the active region reduces the impact ionization at ON-state with high back gate bias levels, and the second p-type layer being closer or is extending into the active region helps prevent excessive Ioff at the pwell finger-end.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1:
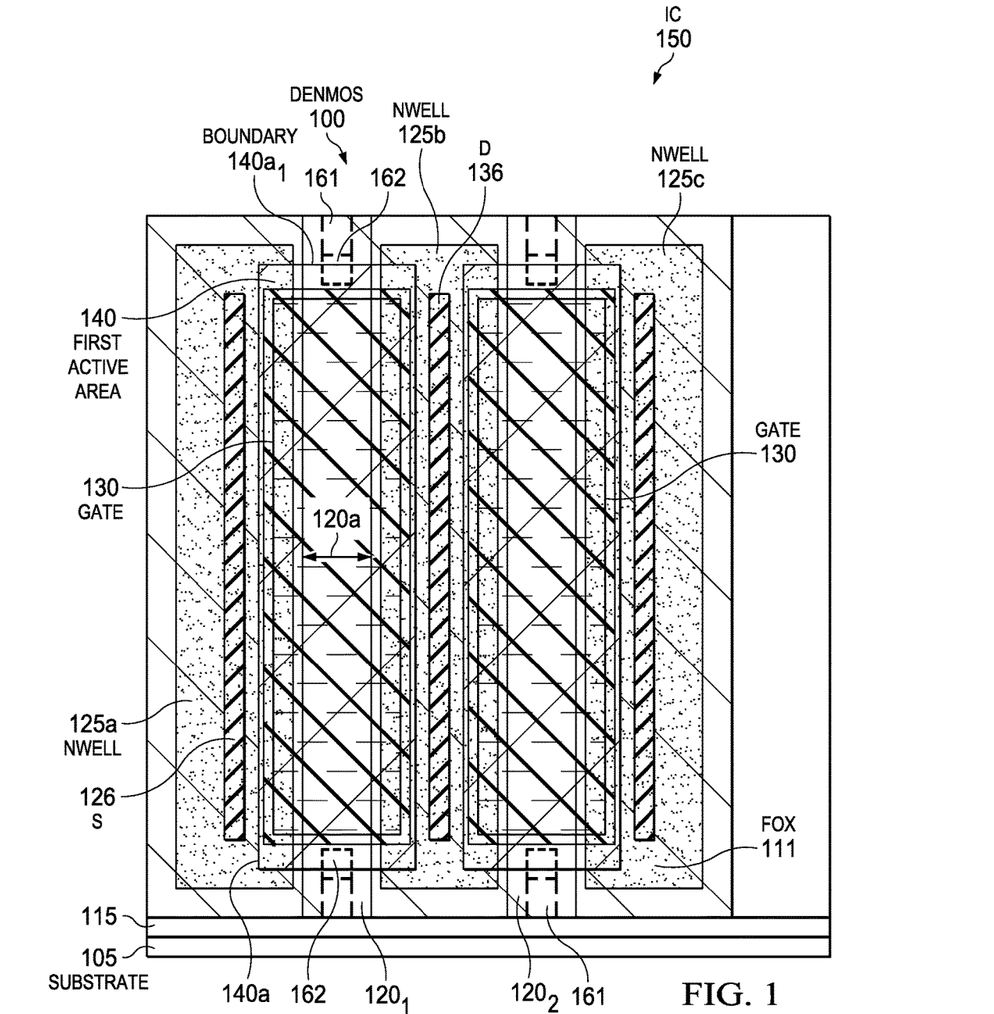
FIG. 1 is top view depiction of an integrated circuit (IC) including an example DENMOS device including a plurality of extra p-type layers at the pwell finger-end adjacent to the WD boundary showing a higher doped first p-type layer further away from the WD boundary and a lower doped second p-type layer closer or over the WD boundary, according to an example embodiment.

FIG. 1 is top view depiction of an IC 150 including an example DENMOS device 100 including a plurality of extra p-type layers at the pwell finger-end adjacent to the WD boundary showing a higher doped first p-type layer 161 further away from the first active area boundary along the pwell width direction (WD boundary) 140$a_1$ and a lower doped second p-type layer 162 closer to or over the WD boundary 140$a_1$, according to an example embodiment. Although shown on IC 150, DENMOS device 100 can also be embodied as a discrete die. The region shown to the right of the DENMOS device 100 generally includes a plurality of other transistors, as well as resistors and capacitors all configured together to provide a circuit function. The first active area is shown as 140a. The first p-type layer 161 is thus spaced back from the active region such as the first active area 140a to reduce the impact ionization at on-state with high back gate bias, and the second p-type layer 162 is closer to or is extending into the active region to help prevent excessive Ioff at the pwell finger-end.

DENMOS device 100 is shown having a symmetric drain structure (has a symmetrical structure with respect to source and drain), although this is not required as disclosed embodiments also apply to asymmetric drain designs. In addition, although the pwell fingers $120_1$ and $120_2$ are shown being rectangular in shape, the pwell fingers can have other shapes, such as having rounded corners. Moreover, although the p-type dopant is generally described as being boron, the p-type dopant may also generally be indium.

The IC 150 comprises a substrate 105 having a doped surface layer 115 thereon. The substrate 105 can be a bulk substrate material (e.g., silicon) that provides the surface layer 115 too, or the surface layer 115 can be an epitaxial layer on a substrate comprising a bulk substrate material. The substrate 105 and/or surface layer 115 can comprise silicon, silicon-germanium, or other semiconductor material. The substrate 105 and surface layer 115 can both be n-type or p-type, with one specific embodiment being a p-type substrate 105 and a p-type surface layer 115 that is an epitaxial layer.

Although the DENMOS device 100 is shown having two (2) pwell fingers $120_1$, $120_2$, more generally, DENMOS device 100 can have a single pwell finger, or more than 2 pwell fingers. The pwell fingers $120_1$, $120_2$ define a pwell length direction and a smaller pwell width direction. The pwell fingers $120_1$, $120_2$ have a pwell doping, and are formed within the surface layer 115, typically by ion implantation. An approximate pwell doping level of $5 \times 10^{15}$ cm$^{-3}$ to $1 \times 10^{17}$ cm$^{-3}$ corresponding to a $1 \times 10^{13}$ cm$^{-2}$ implant dose may be used to form the pwell fingers.

The pwell fingers $120_1$, $120_2$ are shown between nwells. Pwell finger $120_1$ is shown between the first nwell 125a and the second nwell 125b. Pwell finger $120_2$ is shown between the second nwell 125b and a third nwell 125c. An n+ source (S) 126 is shown in the first nwell 125a and an n+ drain (D) 136 is shown in the second nwell 125b.

A gate stack is over a channel region 120a of the pwell fingers $120_1$, $120_2$ including over the pwell finger $120_1$ between the S 126 and the D 136. The gate stack includes a gate dielectric layer and a patterned gate electrode 130 on the gate dielectric layer (the gate dielectric layer is not shown in FIG. 1, see gate dielectric layer 131 in FIG. 2B described below). The gate electrode 130 can comprise polysilicon, or other gate electrode materials such as a metal, and the gate dielectric can comprise dielectrics such as silicon oxide or silicon oxynitride.

A field dielectric layer 111 shown as a field oxide (FOX) layer is on a portion of the surface layer 115 defining active areas (where field dielectric layer 111 is lacking) including a first active area 140 having a first active area/field dielectric boundary 140a including a WD boundary 140a1. The field dielectric layer 111 can comprise a LOCOS oxide layer, in which case there will be a birds beak region in the field dielectric layer 111 transition region at the edge of the active areas. Alternatively, the field dielectric layer 111 can comprise shallow trench isolation (STI).

It is recognized herein that DENMOS devices that include at least one pwell finger adding an extra p-type layer at a pwell finger-end adjacent to the active area boundary in the width direction with the field dielectric (WD boundary) can help prevent high Ioff leakage. However, it is also recognized that this extra p-type layer can produce impact ionization leakage causing transistor shifts at ON-state with high back gate bias levels. As described above, disclosed DENMOS devices instead include a plurality of extra p-type layers at the pwell finger-end adjacent to the WD boundary $140a_1$, including a higher doped first p-type layer 161 at a first minimum distance away from the WD boundary compared to a lower doped second p-type layer 162 that is closer than the first p-type layer 161 to the WD boundary 140a1.

The first p-type layer 161 is spaced back from the active region to reduce the impact ionization at on-state with high back gate bias, and the second p-type layer 162 is closer to or is extending into the active region to help prevent excessive Ioff at the pwell finger-end. It has thus been found that including a higher doped first p-type layer 161 at a first minimum distance away from the WD boundary compared to a lower doped second p-type layer 162 that is closer than the first p-type layer 161 to the WD boundary 140a1 can help remove impact ionization leakage while still preventing excessive Ioff leakage at the finger-end (see Examples described below). The first minimum distance for the p-type layer 161 is generally at least 0.4, such as ≥0.5 μm from said WD boundary 140a1, and the second minimum distance can be zero so that the second p-type layer 162 is over the WD boundary 140a1 and extending into said first active area 140. Although the first p-type layer 161 and second p-type layer 162 are both shown being rectangular in shape, they may have other shapes, such as being circular or oval (elliptical) in shape.

The first p-type layer 161 and the second p-type layer 162 can both be formed by ion implantation typically with boron. For example, a boron dose such as $3 \times 10^{12}$ to $1 \times 10^{13}$ cm$^{-2}$ and an energy in a range 100 keV to 250 keV can be used for implanting a region in the pwell fingers $120_1$ and $120_2$ to form the first p-type layer 161. A boron dose such as $4 \times 10^{11}$ cm$^{-2}$ to $1 \times 10^{12}$ cm$^{-2}$ and an energy in a range 60 keV to 100 keV can be used for implanting a region in the pwell fingers $120_1$ and $120_2$ to form a second p-type layer 162. The dose for the first p-type layer 161 is generally at least 2 times the dose for forming the second p-type layer 162.

The first p-type layer 161 and is typically recessed in the finger length direction from the WD boundary 140a1 by at least 1 μm, such as 2 to 4 μm. The second p-type layer 162 generally overlaps the WD boundary 140a1 as shown in FIG. 1. Both the first p-type layer 161 and second p-type layer 162 are generally recessed from the edges of the pwell fingers $120_1$, $120_2$ as shown in FIG. 1 to help ensure low drain to source leakage.

Figure 2A:
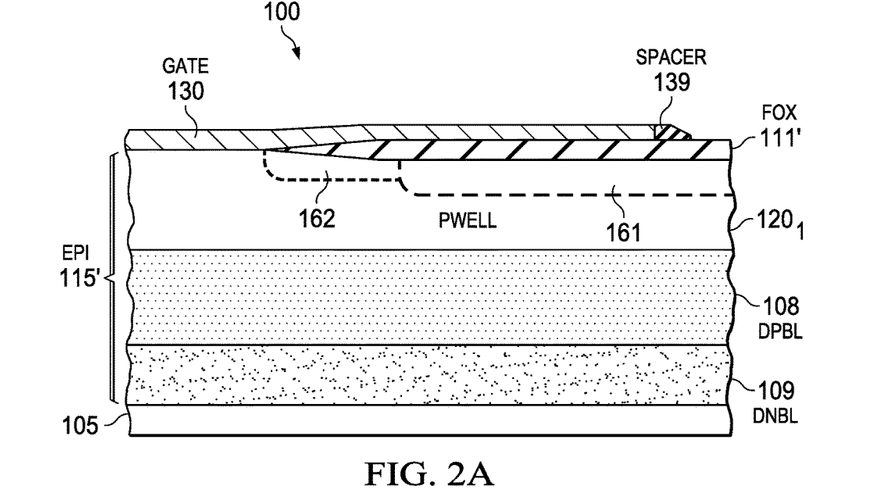
FIG. 2A is a cross sectional depiction of the DENMOS device shown in FIG. 1 cut in the pwell length direction around the active area/field dielectric boundary along the pwell width direction.

FIG. 2A is a cross sectional depiction of the DENMOS device 100 shown in FIG. 1 cut in the pwell length direction around the active area/field dielectric boundary along the pwell width direction. The second p-type layer 162 is shown about half as deep as the first p-type layer 161. The surface layer on the substrate 105 is shown as an epi layer 115'. A spacer 139 is shown on the edge of the gate electrode 130. Beneath the DENMOS device 100 is a deep p-buried layer (DPBL) 108 on a deep n-buried layer (DNBL) 109. The field dielectric layer is shown as FOX 111'.

Figure 2B:
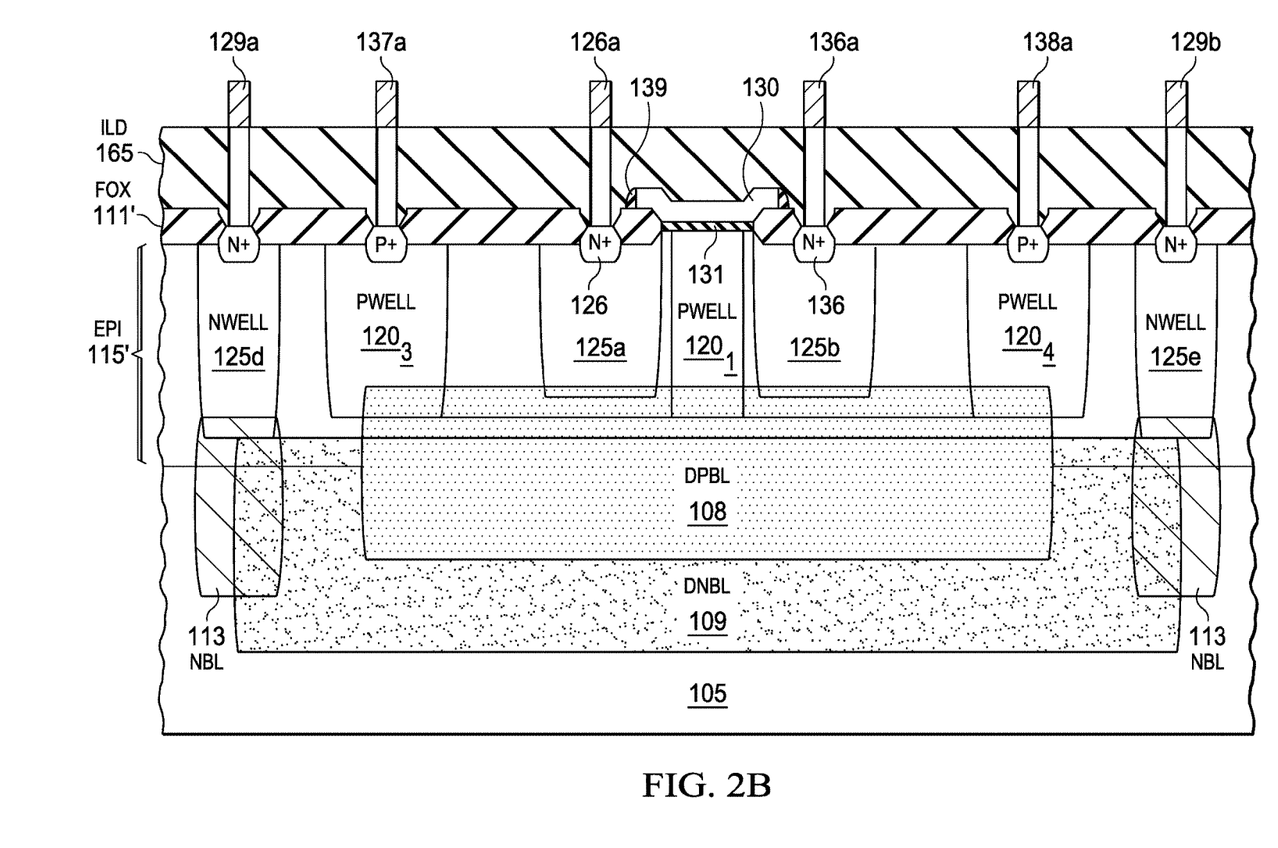
FIG. 2B is a cross sectional depiction of the DENMOS device shown in FIG. 1 cut in the pwell width direction around the center of the pwell finger to show the gate dielectric under the gate electrode.

FIG. 2B is a cross sectional depiction of the DENMOS device 100 shown in FIG. 1 cut in the pwell width direction around the center of the pwell finger to show the gate dielectric layer 131 under the gate electrode 130. Pwell $120_3$ and pwell $120_4$ are shown extending to the DPBL 108 to from a surrounding p-type tank/isolation ring. Nwell 125d and nwell 125e are also shown extending to the DNBL 109 to form an n-type tank/isolation ring for the DENMOS device 100.

Various surface contacts are shown through an interlevel dielectric (ILD) shown as ILD 165. The contacts include contact 126a to the S 126, contact 136a to the D 136, first back gate (BG) contact 137a, second BG contact 138a, as well as nwell contact 129a and nwell 129b to provide contact to the n-type isolation ring. Since as disclosed above disclosed first p-type layer 161 and second p-type layer 162 are provided at the pwell finger edges along the edges in the finger length direction, there is no disclosed first p-type layer 161 and second p-type layer 162 provided in the center portion of the DENMOS device 100 as shown in FIG. 2B.

Figure 3:
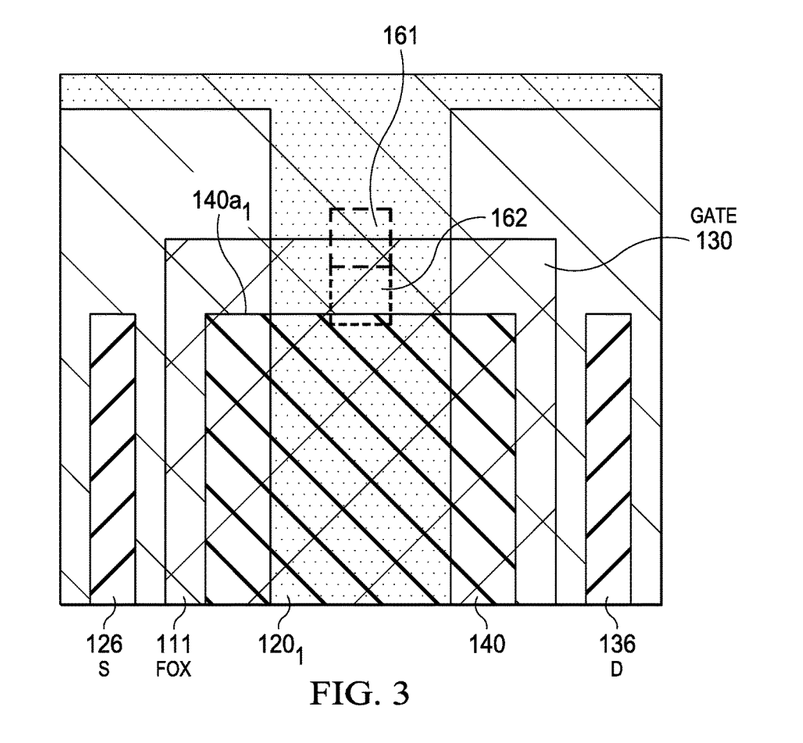
FIG. 3 is an example DENMOS finger end layout showing a finger end including a higher doped first p-type layer and a lower doped second p-type layer at the pwell finger-end adjacent to the WD boundary, according to an example embodiment.

FIG. 3 is an example DENMOS finger end layout showing a pwell finger $120_1$ having a finger end including a higher doped first p-type layer 161 recessed in the finger length direction from the WD boundary 140a1 and a lower doped second p-type layer 162 that is closer than the first p-type layer 161 to the WD boundary $140a_1$, according to an example embodiment. The second p-type layer 162 is shown over the WD boundary $140a_1$ extending into the first active area 140.

Figure 4:
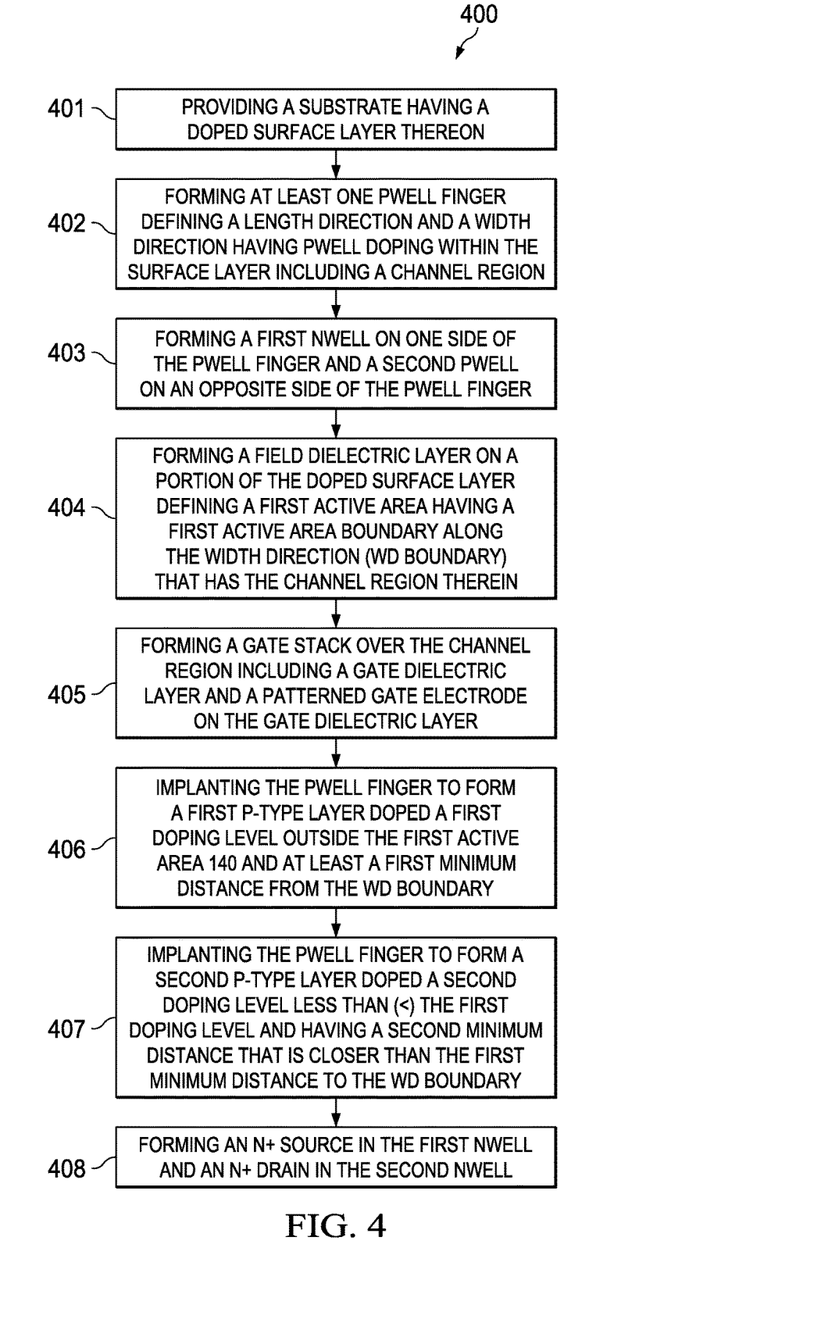
FIG. 4 is a flow chart showing steps in an example method for forming a DEMOS device including a finger end including a higher doped first p-type layer and a lower doped second p-type layer at the pwell finger-end adjacent to the WD boundary, according to an example embodiment.

FIG. 4 is a flow chart showing steps in an example method for forming an IC having a DENMOS device including a finger end including a higher doped first p-type layer and a lower doped second p-type layer at the pwell finger-end adjacent to the WD boundary, according to an example embodiment. Step 401 comprises providing a substrate 105 having a doped surface layer 115 thereon. The surface layer 115 may be an epi layer that is about 15 µm to 40 µm thick. The substrate 105 is generally a p+ or p− substrate, typically boron doped from $1\times10^{16}$ to $1\times10^{19}$ cm$^{-3}$, and the surface layer 115 can be an epi layer having a doping level from $3\times10^{14}$ cm$^{-3}$ to $3\times10^{16}$ cm$^{-3}$. The substrate 105 and the surface layer 115 can both comprise silicon, and can also comprise other materials.

Step 402 comprises forming at least one pwell finger $120_1$ defining a length direction and a width direction having pwell doping within the surface layer 115 including a channel region 120a. A typical pwell implant dose is about $1\times10^{13}$ cm$^{-2}$ to provide an approximate pwell doping level of $5\times10^{15}$ to $1\times10^{17}$ cm$^{-3}$.

Step 403 comprises forming a first nwell 125a on one side of the pwell finger $120_1$ and a second nwell 125b on an opposite side of the pwell finger 120. A phosphorous or an arsenic ion implantation can be used to form the nwells. Step 404 comprises forming a field dielectric layer 111 on a portion of the surface layer 115 defining a first active area 140 having a first active area boundary 140a along the width direction (WD boundary) 140a1 that has the channel region 120a therein. As noted above, the field dielectric layer 111 can comprises a LOCOS oxide or STI oxide.

Step 405 comprises forming a gate stack between the source 126 and drain 136 over the channel region 120a including a gate dielectric layer 131 and a patterned gate electrode 130 on the gate dielectric layer 131.

Step 406 comprises implanting the pwell finger $120_1$ to form a first p-type layer 161 doped a first doping level outside the first active area 140 and at least a first minimum distance from the WD boundary 140a1. Step 407 comprises implanting the pwell finger $120_1$ to form a second p-type doped region 162 doped a second doping level that is less than (<) the first doping level and having a second minimum distance that is closer than the first minimum distance to the WD boundary $140a_1$. Step 406 to form the first p-type layer 161 generally comprises separate photoresist patterning, which can be shared in a BiCMOS process with a digital NMOS channel implant. Step 407 to form the second p-type layer 162 also generally comprises separate photoresist patterning, which in a BiCMOS process can be a shared with a high voltage DEPMOS channel implant.

Regarding the relative doping level of the first p-type layer 161 and the second p-type layer 162 and the p-well/channel, as noted above, the first p-type layer 161 has about a 5× to 30× doping as compared to the doping in the second p-type layer in 162. The pwell for the DENMOS device generally receives a lower implant dose as compared to the first p-type layer 161, however, this pwell generally has a longer thermal diffused cycle compared to first p-type layer 161. However, with various voltage application, thermal cycle, or implant energy, this pwell implant dose can range from lower to a higher dose as compared to the implant to form first p-type layer. Step 408 comprises forming an n+ source 126 in the first nwell 125a and an n+ drain 136 in the second nwell 125b.

Disclosed DENMOS devices including a finger end including a higher doped first p-type layer recessed from the WD boundary and a lower doped second p-type layer closer to or over the WD boundary helps prevent DENMOS off-state and on-state leakage at the finger end with minimum impact to the intrinsic device characteristics, while avoiding the need to use oval-shaped fingers and adding channel termination doping in the active area near the finger end otherwise needed to prevent DENMOS off-state and on-state leakage at the finger end. Oval-shaped fingers and adding channel termination doping in the active area near the finger end undesirably increases device area and adds complication to the device characteristics. Moreover, disclosed DENMOS devices do not increase device area, or involve any new mask level provided the process used includes a lower doped second p-type implant.

EXAMPLES

Disclosed embodiments are further illustrated by the following specific Examples, which should not be construed as limiting the scope or content of this Disclosure in any way.

Figure 5:
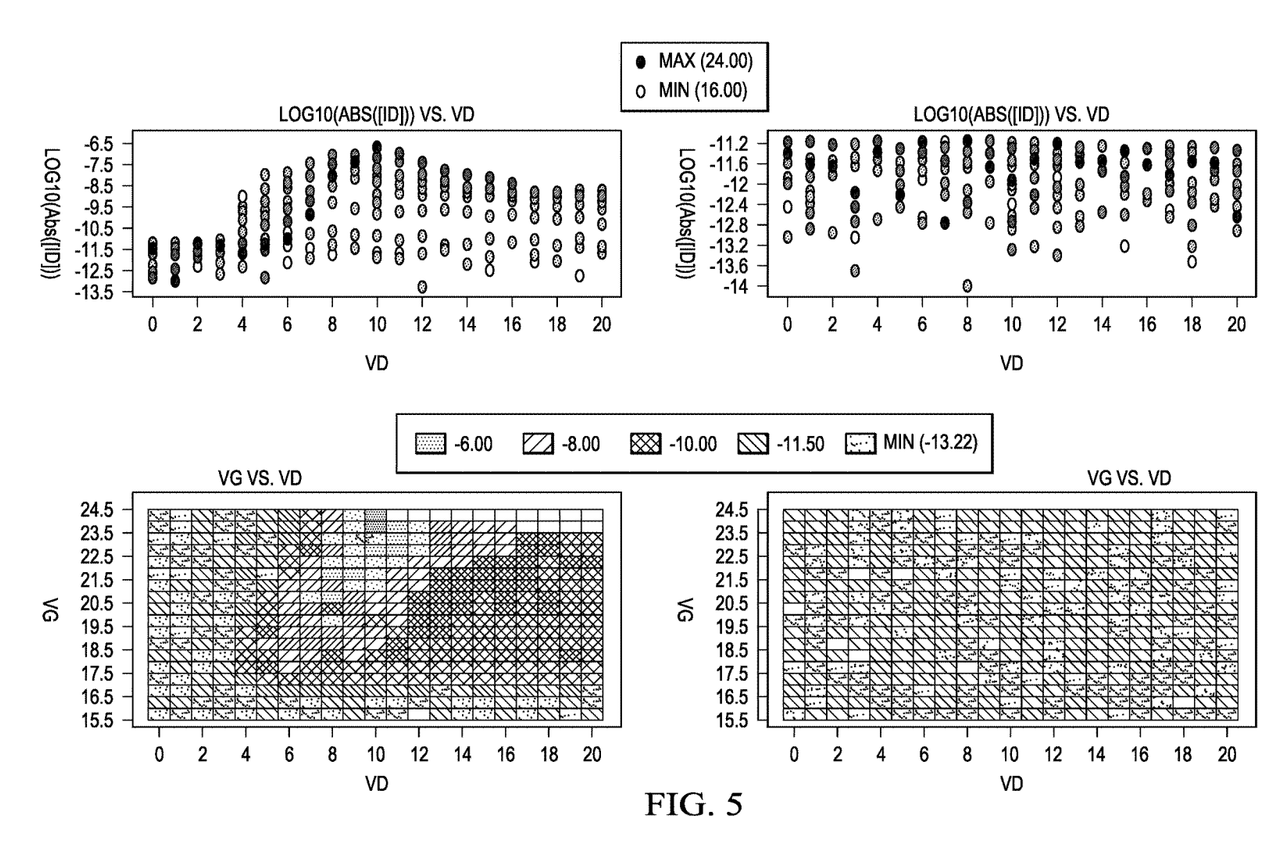
FIG. 5 shows measured transient leakage data comparing a DENMOS device with a known pwell finger design with a disclosed DENMOS device having a higher doped first p-type layer and a lower doped second p-type layer at the pwell finger-end adjacent to the WD boundary.

FIG. 5 shows measured transient leakage data comparing a DENMOS device with a known pwell finger design to a disclosed DENMOS device having a higher doped first p-type layer recessed (about 0.4 µm away) from the WD boundary and a lower doped second p-type layer closer than the first p-type layer to the WD boundary, in this case over the WD boundary. The dose and energy for the boron implant to form the first p-type layer 161 was $5\times10^{12}$ cm$^{-2}$ @ 165 keV. The dose and energy for the boron implant to form the second p-type layer 162 was $1.18\times10^{12}$ cm$^{-2}$ @ 70 keV. The back gate voltage (Vb) was −20V, and Vs was floating. The upper graphs are the absolute leakage values and lower graphs are the leakage contours vs. VG and VD. Transient leakage for the disclosed DENMOS device can be seen to be significantly reduced compared to the known DENMOS device.

Figure 6:
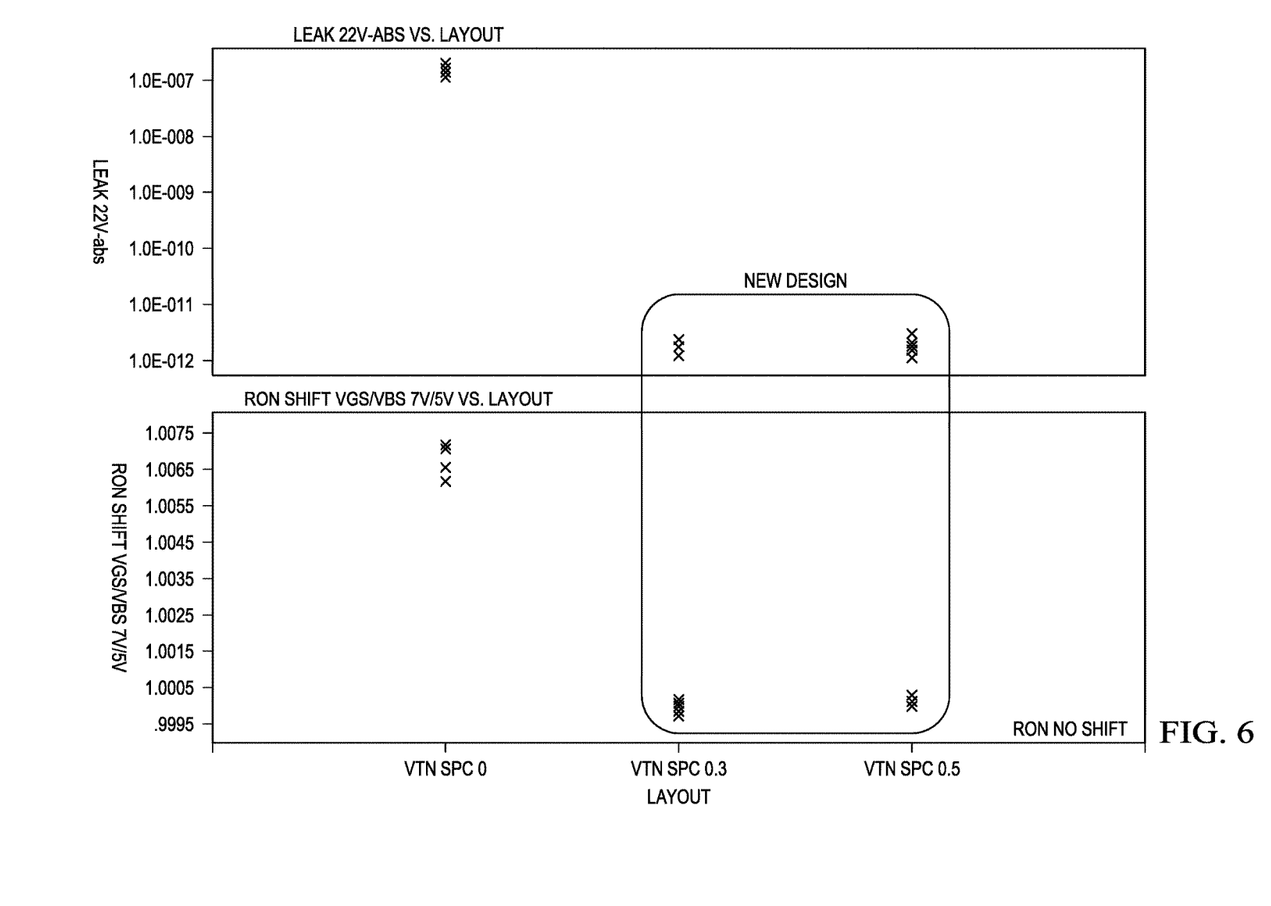
FIG. 6 shows measured DENMOS low temperature peak transient leakage and Ron Shift data for a DENMOS device having a known pwell finger design, and for a DENMOS device including a higher doped first p-type layer and a lower doped second p-type layer at the pwell finger-end adjacent to the WD boundary.

FIG. 6 shows measured DENMOS low temperature peak transient leakage (top) and Ron Shift data (bottom) for a DENMOS device having a known pwell finger design, and with a DENMOS device (shown as a "new design") including a higher doped first p-type layer 161 recessed from the WD boundary and a lower doped second p-type layer 162 closer than the first p-type layer to the WD boundary, in this case again over the WD boundary. The DENMOS On-state peak leakage is shown at −40° C., VG/VB=22V/−22V, $V_S$=Open, $V_D$ sweeps: −22V to 22V on the top, and the Ron shift after a stress of VG/VB=−22V/22V, $V_S$=Open, $V_D$ sweeps: −22V to 22V at the bottom.

Figure 7:
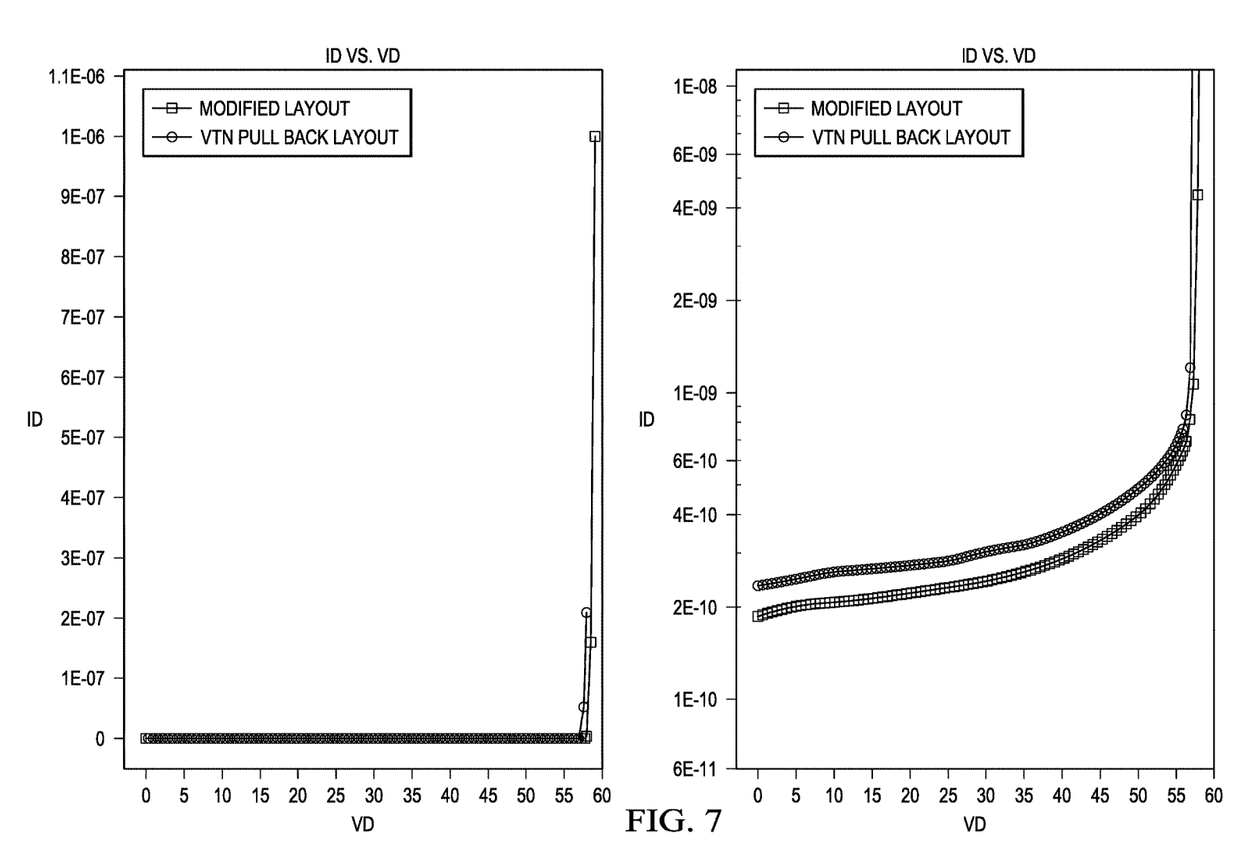
FIG. 7 shows measured DENMOS Off leakage and BVdss characteristics including for a DENMOS device with a disclosed higher doped first p-type layer recessed from the WD boundary and a lower doped second p-type layer closer than the first p-type layer to the WD boundary, in this case again over the WD boundary (shown as a "modified layout"), and for a DENMOS device nwell finger design with a single p-type layer proximate to the WD boundary (shown as a "layout (with) VTN pull back"). These respective DENMOS devices' BVdss and Ioff characteristics are shown to have no significant difference.

FIG. 7 shows measured DENMOS Off leakage and BVdss characteristics (VG=VS=0V at 125° C.) for a DENMOS device with a disclosed higher doped first p-type layer recessed from the WD boundary and a lower doped second p-type layer closer than the first p-type layer to the WD boundary, in this case again over the WD boundary (shown as a "modified layout"), and for a DENMOS device nwell finger design with a single p-type layer proximate to the WD boundary (shown as a "layout with VTN pull back"). The respective DENMOS devices' BVdss and Ioff characteristics can be seen to have no significant difference (the disclosed DENMOS device actually a somewhat lower Ioff).

Disclosed embodiments can be used to form semiconductor die including discrete or IC die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of fabricating an integrated circuit (IC) having an n-channel drain extended metal oxide semiconductor (DENMOS) device, comprising:
   providing a substrate having a doped surface layer thereon;
   forming at least one pwell finger defining a length direction and a width direction having pwell doping within said surface layer including a channel region;
   forming a first nwell on one side of said pwell finger and a second nwell on an opposite side of said pwell finger;
   forming a field dielectric layer on a portion of said surface layer defining a first active area having a first active area boundary along said width direction (WD boundary) that has said channel region therein,
   forming a gate stack over said channel region including a gate dielectric layer and a patterned gate electrode on said gate dielectric layer;
   implanting said pwell finger to form a first p-type layer doped a first doping level outside said first active area and at least a first minimum distance from said WD boundary;
   implanting said pwell finger to form a second p-type layer doped a second doping level less than (<) said first doping level and having a second minimum distance that is closer than said first minimum distance to said WD boundary, and
   forming an n+ source in said first nwell and an n+ drain in said second nwell.

2. The method of claim 1, wherein said first p-type layer is at least 0.5 µm from said WD boundary, and wherein said second minimum distance is zero so that said second p-type layer is over said WD boundary and extending into said first active area.

3. The method of claim 1, wherein said field dielectric layer is formed by a Local Oxidation of Silicon (LOCOS) process.

4. The method of claim 1, wherein said first p-type layer and said second p-type layer are both formed after forming said field dielectric layer.

5. The method of claim 1, wherein said at least one pwell finger comprises a plurality of said pwell fingers.

6. The method of claim 1, wherein said first doping level is at least two (2) times said first doping level.

7. An n-channel drain extended metal oxide semiconductor (DENMOS) device, comprising:
   a substrate having a doped surface layer thereon;
   at least one pwell finger defining a length direction and a width direction (pwell width direction) having pwell doping formed within said surface layer;
   a first nwell on one side of said pwell finger including an n+ source therein and a second nwell on an opposite side of said pwell finger including an n+ drain;
   a gate stack over a channel region of said pwell finger between said source and said drain including a gate dielectric layer and a patterned gate electrode on said gate dielectric layer;
   a field dielectric layer on a portion of said surface layer defining a first active area having a first active area boundary along said width direction (WD boundary) that has said channel region therein;
   a first p-type layer doped a first doping level outside said first active area and at least a first minimum distance from said WD boundary, and
   a second p-type layer doped a second doping level less than (<) said first doping level and having a second minimum distance that is closer than said first minimum distance to said WD boundary.

8. The DENMOS device of claim 7, wherein said second minimum distance is zero so that said second p-type layer is over said WD boundary and extending into said first active area.

9. The DENMOS device of claim 7, wherein said field dielectric layer comprises a Local Oxidation of Silicon (LOCOS) oxide.

10. The DENMOS device of claim 7, wherein said first p-type layer is at least 0.5 µm from said WD boundary, and wherein said first p-type layer and said second p-type layer are both recessed from an edge of said pwell finger in said pwell width direction.

11. The DENMOS device of claim 7, wherein said first doping level is at least two (2) times said first doping level.

12. The DENMOS device of claim 7, wherein said at least one pwell finger comprises a plurality of said pwell fingers.

13. The DENMOS device of claim 7, wherein said DENMOS device has a symmetric drain structure.

14. The DENMOS device of claim 7, further comprising an n-type isolation ring surrounding said DENMOS device.

15. An integrated circuit (IC) comprising a substrate including a doped surface layer thereon having an n-channel drain extended metal oxide semiconductor (DENMOS) device formed in said doped surface layer, said DENMOS device comprising:
   at least one pwell finger defining a length direction and a width direction (pwell width direction) having pwell doping formed within said surface layer;
   a first nwell on one side of said pwell finger including an n+ source therein and a second nwell on an opposite side of said pwell finger including an n+ drain;

a gate stack over a channel region of said pwell finger between said source and said drain including a gate dielectric layer and a patterned gate electrode on said gate dielectric layer;

a field dielectric layer on a portion of said surface layer defining a first active area having a first active area boundary along said width direction (WD boundary) that has said channel region therein, a first p-type layer doped a first doping level outside said first active area and at least a first minimum distance from said WD boundary, and a second p-type layer doped a second doping level less than (<) said first doping level and having a second minimum distance that is closer than said first minimum distance to said WD boundary.

16. The IC of claim 15, wherein said field dielectric layer comprises a Local Oxidation of Silicon (LOCOS) oxide.

17. The IC of claim 15, wherein said second minimum distance is zero so that said second p-type layer is over said WD boundary and extending into said first active area.

18. The IC of claim 15, wherein said first doping level is at least two (2) times said first doping level.

\* \* \* \* \*